United States Patent Office 3,395,057

Patented July 30, 1968

3,395,057
METHOD FOR ETCHING POLYIMIDE PLASTIC FILM

Herbert J. Fick, Northfield, Minn., assignor to G. T. Schjeldahl Company, Northfield, Minn., a corporation of Minnesota No Drawing. Filed Dec. 8, 1964, Ser. No. 416,872
4 Claims. (Cl. 156—3)

ABSTRACT OF THE DISCLOSURE

A technique for etching thermosetting polyimide films, such as polypyromellitimide, by subjecting these films to an etchant consisting essentially of hydrazine. The etchant may be utilized to texture or perforate polypyromellitimide films, and is particularly adapted to the preparation of printed wiring elements which include a metallic film, such as copper, mounted on a substrate film of polypyromellitimide.

The present invention relates generally to a method for treating bodies or films which consist essentially of a thermosetting polyimide such as polypyromellitimide, and more specifically to a method for etching polypyromellitimide films.

Polypyromellitimide films are the product of a polycondensation reaction between pyromellitic dianhydride and an aromatic diamine. This material, is characterized by its high temperature and dielectric properties. In addition, this material has outstanding mechanical properties from liquid helium temperatures to temperatures of from 500° to 600° C. Among the electrical properties which are deemed desirable are high resistivity, high dielectric strength, and low loss characteristics, these properties being relatively constant with temperature and frequency. The mechanical and electrical properties are not significantly deteriorated after exposure to elevated temperatures for prolonged periods. Polypyromellitimide films are commercially available under the code name "H-Film" from E. I. du Pont de Nemours Corporation of Wilmington, Del.

Polypyromellitimide is obtained as a reaction product from the polycondensation reaction between pyromellitic dianhydrides and aromatic diamine, for example, 4,4'-diaminodiphenyl ether. This material is readily cast into films and is uniquely suited for certain electrical applications because of its ideal electrical properties.

In order to fabricate electrical devices, particularly electrical components such as printed wiring or the like, it is necessary to bond a film of metal to the surface of the polypyromellitimide material. The material is normally provided as a smooth surfaced film which is difficult to prepare for adhesion with any presently available adhesive materials. In addition, the material is difficult to chemically mill or form since the material has substantial solvent resistance. For chemical milling operations, it is practically essential that a solvent-etchant be found which will provide good edge definition in the finished product and will not form undesirable edge surfaces through contact with or exposure to the solvent-etchant material.

In accordance with the present invention, it has been determined that an aromatic polyimide film consisting essentially of a polypyromellitimide film can be readily treated and milled chemically by an etchant consisting essentially of a solution of hydrazine and water. The hydrazine is a specific etchant for polypyromellitimide and has been found to be a desirable surface preparant for adhesive bonding operations as well. In this connection, the hydrazine solution may be used as an etchant for the aromatic polyimide, or may be used to provide a texture in the surface to enhance the adhesion for bonding materials such as metal foils and the like to the surface thereof.

Therefore, it is a principal object of the present invention to provide an improved technique for etching treatment of polypyromellitimide films.

It is still a further object of the present invention to provide an improved technique for treating surfaces or bodies of polypyromellitimide films through the use of an aqueous solution of hydrazine.

It is yet a further object of the present invention to provide an improved technique for treating polypyromellitimides derived from pyromellitic dianhydride and an aromatic diamine by the use of an aqueous solution of hydrazine.

Other and further objects of the present invention will become apparent to those skilled in the art upon a study of the following specification and appended claims.

In accordance with the preferred method of the present invention, a polyimide film is treated with an aqueous solution of hydrazine in order to etch away all or part of the aromatic polyimide material. Polypyromellitimide films are available in various thicknesses, such as for example, from 1 mil to 5 mils. Until the present invention, there was no known treatment for the surface of this material in order to enhance the adhesion properties, and also in order to make possible chemical milling of this material.

In one aspect of the present invention, a thin metallic film, such as copper, may be bonded to the surface of a film of polypyromellitimide film in order to form a printed wiring blank which is adaptable for use under rigorous electrical and environmental conditions. In this connection, thin copper foil, for example, 2 ounce copper, may be prepared for mounting and mounted on the film as required. The foil surface may be etched using conventional techniques, photo or silk screen resist and the foil etched with copper etchants. The foil pattern may then be used as the resist, as desired. The hydrazine resist foil pattern may also be prepared by die stamp operations, the stamped foil being adhesively bonded to the film. One photo resist compatible with polypyromellitimide is that certain photo resist material identified by the code name "KPR" and available from Eastman Kodak Company of Rochester, New York. The resists may be applied to the aromatic polyimide surface by either dip, spray, roller coating, or like operations, and the image prepared thereafter. As an alternative, other suitable resist coating techniques may be employed, such as screen printing techniques or the like. Other suitable resists which have been found to tolerate hydrazine are Naz-Dar #211 Circuit Black which is a solution of petroleum asphalt in ethylene glycol monobutyl ether, and #145–10–L, Warnow Process Paint Company, which is a black pigmented vinyl resin solution containing carbon black in a solution of isophorone. Each of these resists are available commercially. The laminate is then exposed to a solution of concentrated hydrazine, and the hydrazine is caused to come into contact with the surface of the exposed aromatic polyimide film by conventional chemical milling techniques. The areas, such as the hole pattern areas, exposed to the hydrazine are etched away quickly, a 1 mil film of polypyromellitimide being completely etched away at room temperature in a period of one minute with concentrated hydrazine. A 50 percent solution of hydrazine and water will require a period of about 8 minutes to completely etch a 1 mil film of this material. Solutions containing less than 50 percent of hydrazine have been found to be too slow to be considered generally practical. After the laminate has been exposed to hydrazine, it is rinsed in water. Where required, interfering adhesive films may be removed with a suitable solvent or etchant. An example is the removal of polyester adhesives from copper and polypyromellitimide film using concentrated sulfuric acid. This reagent will also remove "KPR" photo resist and #211 Circuit Black screen printing resist. Solvents may also be used for removal of the screen printing resists, examples being acetone, toluene, and mineral spirits. These etchants and solvents when used with care will not significantly harm the copper or the polypyromellitimide film. The copper foil may then be etched to prepare the desired conductor pattern. The metallic portion of the laminate material may then be coated with a suitable resist and thereafter exposed to a suitable etchant which will etch away the exposed metal from the areas where desired. A solution of ferric chloride or the like is generally suitable for use in connection with etching the copper foil. By a similar technique, other metal laminate foils or the like may be prepared.

It is not essential that the polypyromellitimide film be etched entirely through the transverse thickness, and the technique is accordingly useful in preparing a pattern on a film preparatory to bonding a second material thereto. In this connection, the dilute solution of hydrazine is exposed to the surface of the film for a period of time sufficient to at least texture the surface and make it a more desirable medium for adhesion. Subsequent to this treatment, conventional laminating techniques may be employed.

The present invention extends the usefulness of polypyromellitimide films through the accurate placement of hole patterns as well as through surface etching. In this regard, a hole pattern may be prepared on the surface of a plastic material which forms a component part of a metal-plastic laminate, either prior to or subsequent to application or treatment of the metal portion. The edge definition of the etch pattern is accurate and uniform, and the material immediately adjacent to the film is not adversely treated.

It will be appreciated that various modifications of the present invention may be practiced without actually departing from the spirit and scope of the present invention.

The examples given herein are for purposes of illustration only and are not to be construed as limitations upon the scope to which this invention is otherwise entitled.

What is claimed:

1. The method of preparing a printed circuit comprising the steps of:

(a) bonding a film of a metallic conductor to the surface of a substrate film of polypyromellitimide;
(b) forming a circuitry pattern in said metallic conductor to expose alternate surface areas of metallic conductor and substrate film;
(c) covering a portion only of the surface of said exposed substrate film with an amine-tolerant resist, and
(d) subjecting the exposed portions of said substrate film surface to an etchant consisting essentially of hydrazine.

2. The method as set forth in claim 1 being particularly characterized in that said metallic conductor is copper.

3. The method as set forth in claim 1 being particularly characterized in that said polypyromellitimide film is exposed to hydrazine until a bore is formed through said polypyromellitimide substrate film.

4. The method as set forth in claim 1 being particularly characterized in that said etchant consists of an aqueous solution of hydrazine containing from about 50 percent to about 100 percent hydrazine, balance water.

References Cited

UNITED STATES PATENTS 3,179,634 4/1965 Edwards ............ 260—78

FOREIGN PATENTS 835,844 5/1960 Great Britain.

OTHER REFERENCES

Hydrazine in Organic Chemistry, Byrkit and Michalek in Industrial and Engineering Chemistry, pp. 1862–71, vol. 42, No. 9.

JACOB H. STEINBERG, *Primary Examiner.*